United States Patent [19]

Levy et al.

[11] 3,972,424
[45] Aug. 3, 1976

[54] AUTOMATIC WAFER LOADING AND PRE-ALIGNMENT SYSTEM

[75] Inventors: Kenneth Levy, Saratoga; David Corbin, Sunnyvale; Alan J. Fleming, Santa Clara, all of Calif.; David Friedman, Framingham; Gilbert G. Fryklund, Winchester, both of Mass.; Vance Parker, San Jose; Gerd Schliemann, Sunnyvale, both of Calif.

[73] Assignee: The Computervision Corporation, Bedford, Mass.

[22] Filed: Aug. 14, 1975

[21] Appl. No.: 604,805

Related U.S. Application Data

[62] Division of Ser. No. 340,281, March 12, 1973, Pat. No. 3,902,615.

[52] U.S. Cl. ............................... 214/1 Q; 198/257; 198/261
[51] Int. Cl.² ........................................ B65G 47/24
[58] Field of Search ............ 214/1 Q; 198/257, 258, 198/261

[56] References Cited
UNITED STATES PATENTS

3,297,134  1/1967  Pastuszak........................... 198/257
3,797,889  3/1974  Wilkinson........................ 198/257 X

Primary Examiner—L. J. Paperner
Assistant Examiner—George F. Abraham
Attorney, Agent, or Firm—Richard J. Birch

[57] ABSTRACT

An automatic wafer loading and pre-alignment system for integrated circuit wafer-mask Aligners. A belt feed track system is employed to transport wafers from a "send" wafer storage carrier to a wafer pre-alignment station. The wafer is machanically pre-aligned with respect to the wafer chuck of the Aligner by means of a roller arm and flat-finder system. After completion of the pre-alignment process, the Aligner turntable is rotated to carry the pre-aligned wafer and chuck to the home position of the turntable and at the same time position another chuck at the pre-alignment station. If the new chuck at the pre-alignment station contains a wafer, the wafer is transported from the chuck to a "receive" wafer storage carrier by means of a belt return track system. The feed and return wafer belt track systems have a common portion between the pre-alignment station and the respective "send" and "receive" wafer storage carriers. Photosensors are used to detect the presence or absence of wafers at critical locations in the loading system and at the pre-alignment station.

7 Claims, 18 Drawing Figures

AUTOMATIC WAFER LOADING AND PRE-ALIGNMENT SYSTEM

This is a division of application Ser. No. 340,281, now U.S. Pat. No. 3,902,615, filed Mar. 12, 1973.

BACKGROUND OF THE INVENTION

The present invention relates to integrated circuit wafer processing equipment and, more specifically, to an automatic wafer loading and pre-alignment system for integrated circuit wafer-mask Aligners. Manually operated and automatic Aligners for aligning a printed circuit wafer to a mask are well known in the integrated circuit processing field. Representative examples of mask alignments systems include the Models CA-400 and CV-100 mask Aligners manufactured and sold by the Cobilt Division of The Computervision Corporation, 1135 Arques Ave. Sunnyvale, Calif. 94086. The patent literature contains substantial information on mask alignment systems e.g. U.S. Letters Pat. Nos. 3,587,334; 3,604,546; 3,617,751; 3,622,856; 3,660,157; and 3,671,748.

In existing mask alignment systems, the individual, unexposed wafer is manually loaded into a chuck which is positioned on the Aligner turntable. The turntable carrying the chuck and wafer is then rotated into the alignment and exposure position. After exposure, the turntable is again rotated to allow the operator to manually remove the now exposed wafer from the chuck. The individual, manual loading and handling of both the unexposed and exposed wafers is undesirable both in terms of subjecting the wafer to excessive handling as well as increasing the probability of physical damage to the wafer.

It is, accordingly, a general object of the present invention to provide an automatic wafer loading and pre-alignment system for integrated circuit wafer-mask Aligners which eliminates individual wafer handling while achieving accurate automatic pre-alignment and throughput.

It is a specific object of the invention to provide an automatic wafer loading and pre-alignment system which can be interfaced with existing manual and automatic mask Aligners.

It is another object of the invention to provide indexable carriers for storing the unexposed and exposed wafers.

It is a feature of the invention that the unexposed and exposed wafer carriers are accurately indexed in synchronization with each other.

It is still another object of the invention to provide feed and return track systems for transporting the unexposed and exposed wafers, respectively, in which the two track systems have a common portion between the wafer carriers and a wafer pre-alignment station.

It is another feature of the invention that the wafer carriers, feed track systems and wafer pre-alignment station can accommodate different sized wafers.

It is still another object of the invention to provide a wafer pre-alignment system which produces accurate and repeatable pre-alignment of unexposed wafers on the Alignert's turntable.

These objects and other objects and features of the present invention will best be understood from a detailed description of a preferred embodiment thereof, selected for purposes of illustration and shown in the accompanying drawings, in which;

Figure 1:
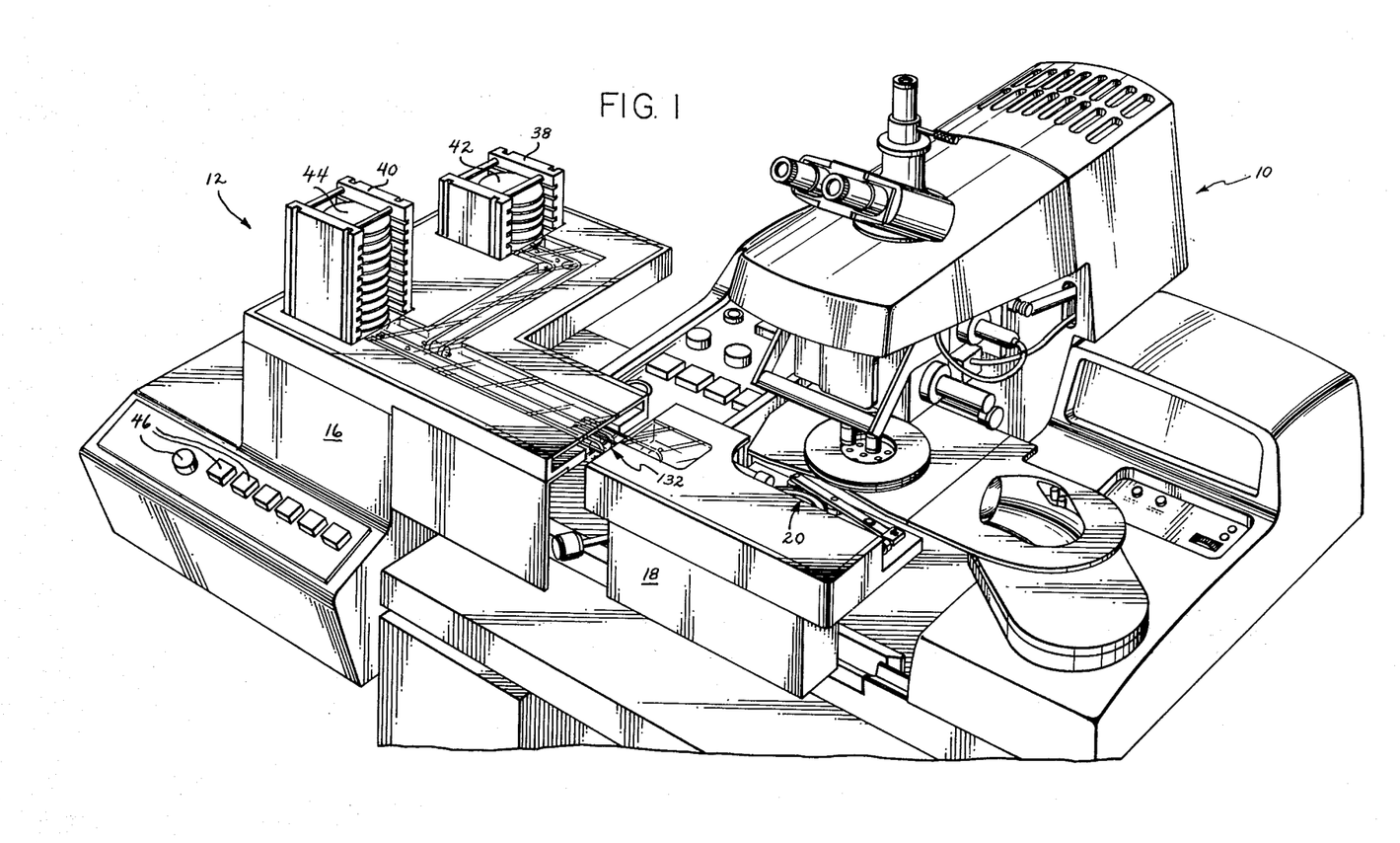
FIG. 1 is a view in perspective of a conventional mask Aligner showing the automatic wafer loading and pre-alignment system of the present invention interfaced thereto.
Figure 13:
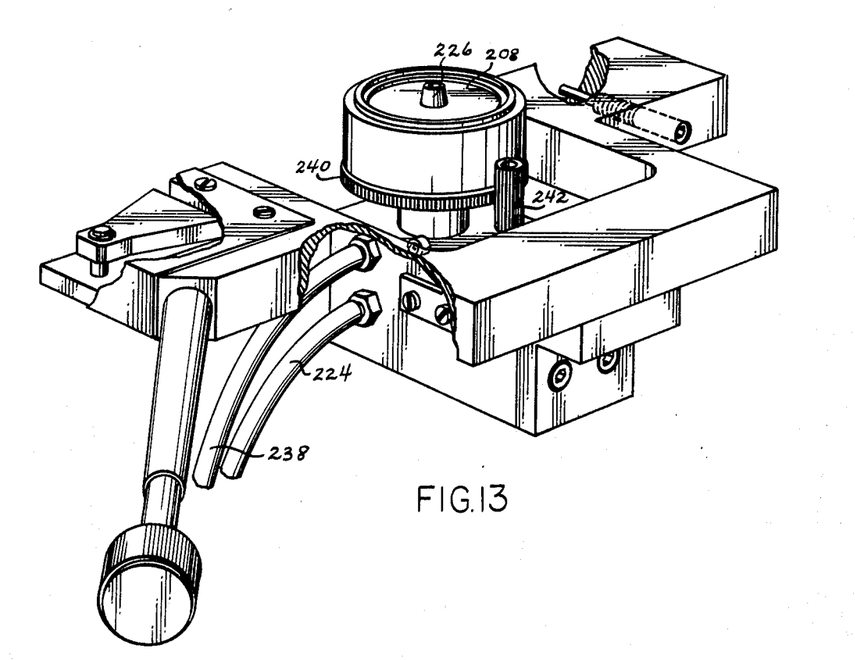
FIG. 13 is a view in perspective showing the pre-alignment station chuck lifter; and, FIG. 14 is a view in side elevation and partial section showing the relationship of the pre-alignment station chuck lifter of FIG. 13 with respect to a chuck positioned on the Aligner turntable.
Figure 14:
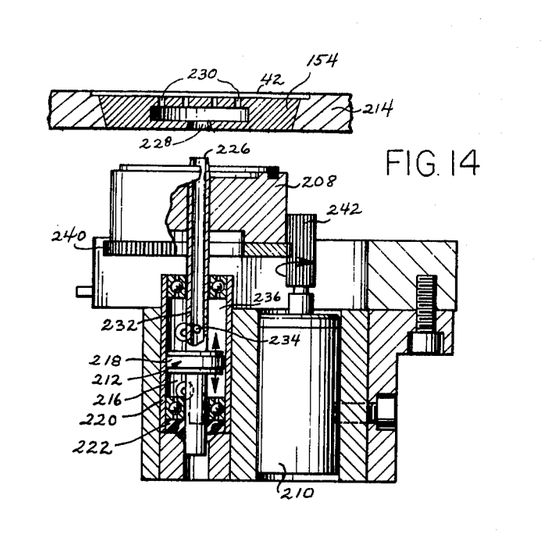

Turning now to the drawings, there is shown in FIG. 1 a conventional integrated circuit mask Aligner indicated generally by the reference numeral 10 to which is interfaced an automatic wafer loading and pre-alignment system constructed in accordance with the present invention and indicated generally by the reference numeral 12. The major assemblies of the wafer loading and pre-alignment system 12 comprise: a platform assembly 14 (FIGS. 2, 3 and 4); a feed track assembly 16 (FIG. 5); a center track assembly 18 which includes a wafer pre-alignment station 20 (FIGS. 1, 6 and 7); and a chuck lifter assembly 22 (FIGS. 13 and 14). The structure of each of these major assemblies will be discussed below and, where appropriate for purposes of understanding, the operation of the assemblies will be presented in conjunction with the structural description.

PLATFORM ASSEMBLY

Referring now to FIGS. 1 through 4, the platform assembly 14 comprises: a "receive" (front) platform 24; a "send" (rear) platform 26; a pivotally mounted rocker lever 28; guide posts 30; a lead screw 32; an elevator drive assembly indicated generally by the reference numeral 34; and, platform-position limit switches 36a and 36b. Positioned on platforms 24 and 26, respectively, are wafer-containing carriers 38 and 40. Unexposed wafers 42 are stored in the "send" wafer storage carrier 38 on the rear platform. After being exposed in the mask Aligner 10, the exposed wafers 44 are returned to and stored in the "receive" wafer storage carrier 40 located on the front platform.

The purpose of the platform assembly 14 is to position the "receive" and "send" carriers containing the wafers, and to change their relatively positions by indexing the platforms in an accurate manner. The operation of the platform system can best be understood by referring to the perspective views of FIGS. 2 and 3.

The specific details of the electronic control circuitry, electrical and pneumatic power supplies and valving systems have been omitted from the drawings for purposes of clarity. However, since these components are well known to those skilled in the art, the following description is believed sufficient to enable such persons to practice the present invention. Operational control of the various assemblies of the wafer loading and pre-alignment system of the present invention is provided by manually actuated operator controls which are representationally shown in FIG. 1 and are identified generally as 46.

The indexing of the wafer carrier platforms is accomplished in the following manner. When the electronics (not shown) commands the platform assembly to index, it supplies electrical power to an elevator drive assembly motor 48. The polarity of the voltage applied to the drive motor 48 controls the direction in which the motor rotates which in turn determines whether the particular platform is raised or lowered. The polarity is determined by the electronics which monitors the operator actuated UP and DOWN control buttons included in the operator controls 46. The output from motor 48 is taken from a motor drive pulley 50 and applied to a Geneva mechanism input pulley 52 by a timing belt 54. The Geneva mechanism, indicated generally by the reference numeral 55, translates the 180° input pulley rotation to a 90° output pulley rotation on output pulley 56. During the first 45 degrees of input pulley rotation, the motor 48 is allowed to reach its normal operating speed. During this period, the Geneva mechanism cam surface 58 prevents rotation of the output pulley 56. During the next 90 degrees of input pulley rotation, roller 60 enters slot 62 to provide a controlled acceleration of the output pulley 56. The controlled acceleration is initially slow, then reaches a maximum and then slows down again. During the last 45° of input pulley rotation, the motor 48 is allowed to come to a halt. The cam surface 58 again prevents rotation of the output pulley 56 during this time. When the motor has driven the input pulley through 135° of rotation (the output pulley 56 has just completed its 90° rotation), a shutter 64 attached to the input pulley blocks the light path between a photosensor 66 and a LED 68. This signals the electronics to shut off the motor 48.

The effect of the Geneva mechanism 55 and drive motor 48 is to provide a precise 90° rotation of the output pulley 56 with controlled angular acceleration. This motion is transferred through a timing belt 70 to a pulley 72 mounted on lead screw 32. The lead screw is threaded into an anti-backlash nut 74 (FIG. 3) which is attached to the "receive" platform 24. Since the lead screw 32 is indexed by the Geneva mechanism, the receive platform 24 is raised or lowered by a distance which is determined by the diameter of the output pulley. The diameter of the output pulley is selected to provide an indexing distance corresponding to the spacing between wafers in the carriers (⅛ or 3/16-inch).

A bushing block 76 containing two bushings is attached to the "receive" platform 24. One of the guide rods 30 passes through the bushings to keep the "receive" platform from tilting. The "send" platform 26 is aligned by two of the guide rods 30 and a single bushing block 78.

Figure 2:
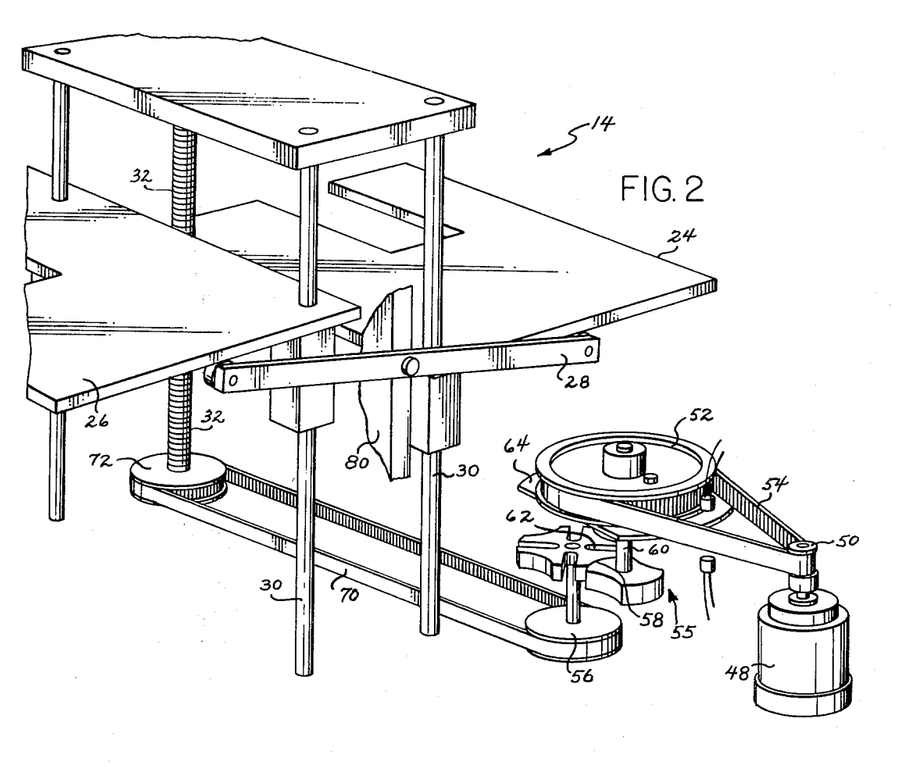
FIG. 2 is a view in perspective showing the "send" and "receive" wafer carrier platforms and the drive system therefor.
Figure 3:
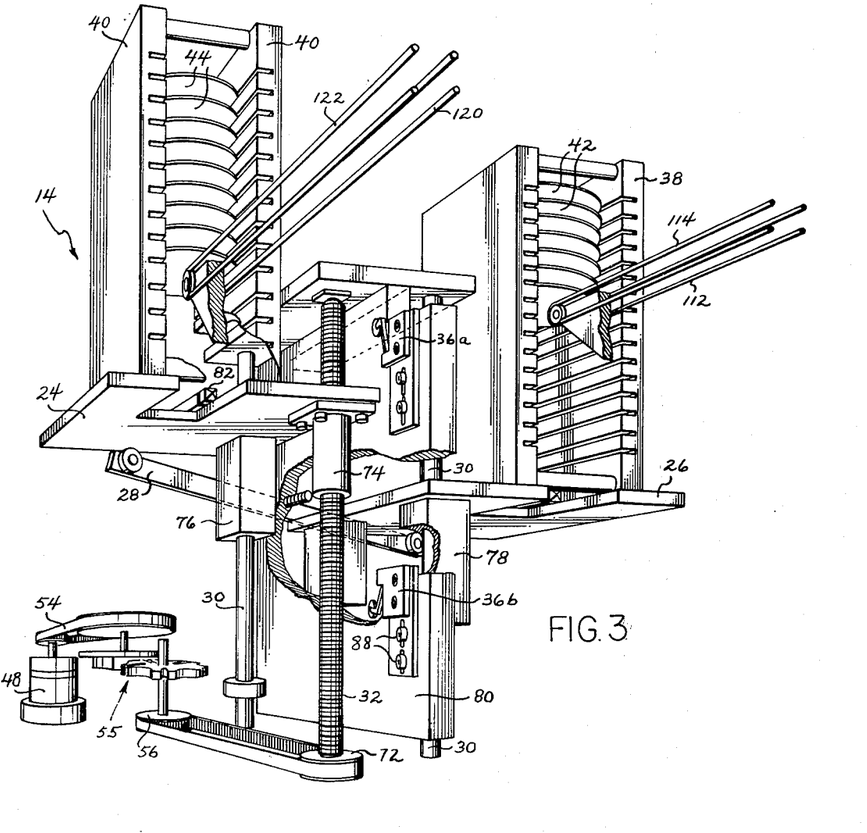
FIG. 3 is another view in perspective showing the relationship of the "send" and "receive" platforms and wafer carriers with respect to the wafer feed and "return" belt systems.

The two platforms are linked together by the previously mentioned rocker lever 28 which is pivotally mounted on the relatively fixed platform assembly frame 80, a portion of which is shown in FIGS. 2 and 3. The link between the two platforms is maintained by the weight of the platforms. Each platform contains two adjustable carrier locators 82 and 84 (FIGS 3 and 4) which are secured to the platform through slotted holes 86. The carrier locators are adjusted to accommodate different sized wafer carriers.

The position of the "receive" platform 24 is sensed by the limit switches 36a and 36b shown in FIG. 3. The switches are employed to sense the first and last wafer positions for the carrier and prevent the platform from being driven beyond the normal operating limits by an electronic interlock. The upper switch 36a senses the "receive" carrier full-up position (last wafer) while the lower switch 36b senses the full-down position (first wafer). The lower switch 36b can be mounted at one of two heights with respect to the base by means of fasteners 88. The upper position of limit switch 36b is employed for ⅛-inch carrier spacing and the lower position is used for 3/16-inch spacing.

FEED TRACK ASSEMBLY

Figures 5, 5A, 5B:
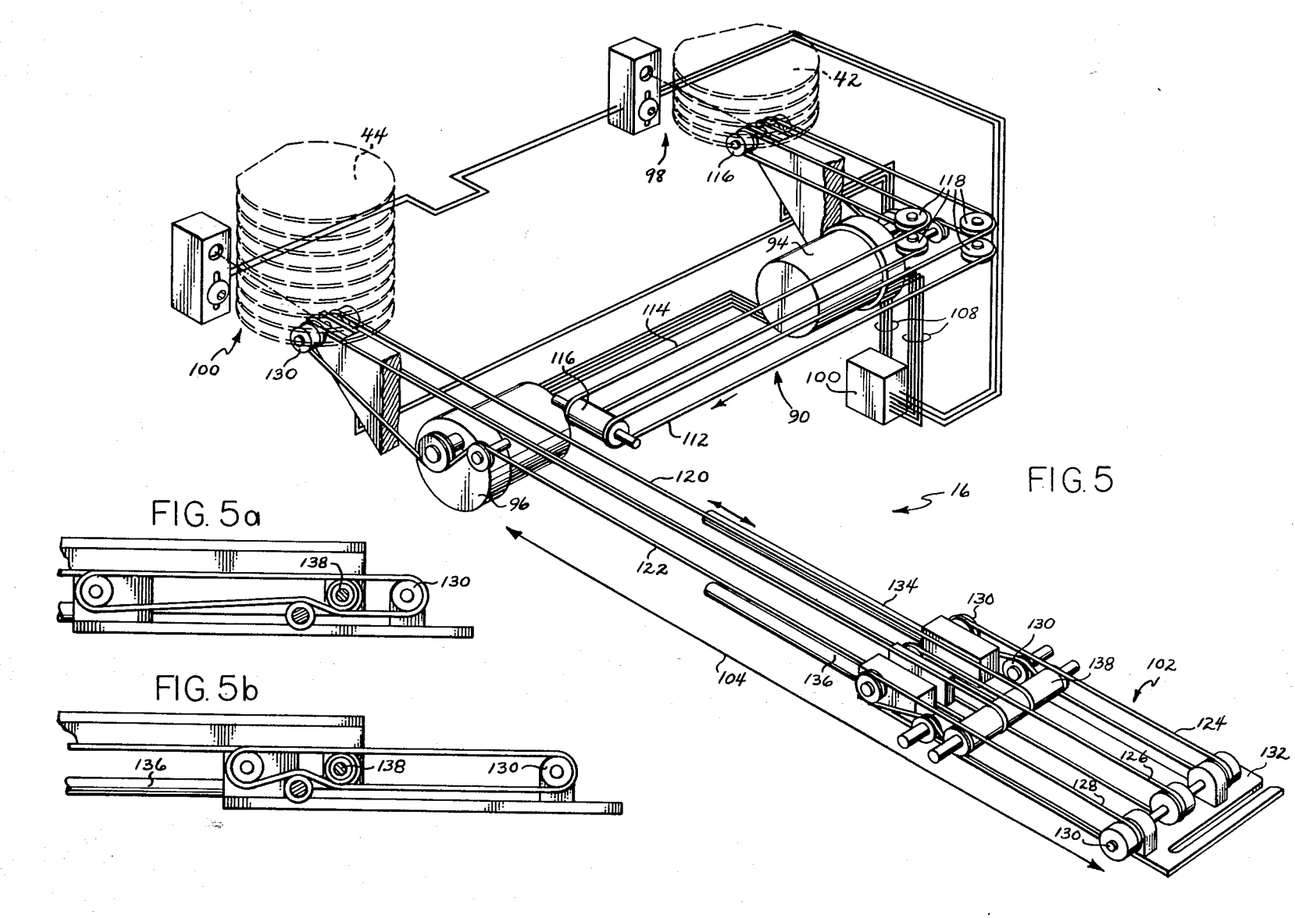
FIG. 5 is a diagrammatic view in perspective showing the "feed" wafer and "return" wafer belt carrier systems.
FIGS. 5a and 5b are views in side elevation illustrating the adjustability of the "transfer" track portion of the belt carrier system.

Referring now to FIG. 5, there is shown in diagrammatic perspective view the feed track assembly 16. The feed track assembly 16 comprises: a feed or "send" wafer belt system 90; a return or "receive" wafer belt system 92; drive motors 94 and 96 for the "send" and "receive" wafer belt systems, respectively; and, "send" and "receive" wafer photosensor systems 98 and 100, respectively. A transfer track, indicated generally at 102, is employed to mechanically interface the feed track assembly to the center track assembly 18. The relative locations of the wafer belt systems and track assemblies can best be seen in FIG. 1.

The purpose of the feed track assembly is to transfer unexposed wafers 42 from the "send" wafer carrier 38 to the center track assembly 18 and to transfer returning exposed wafers 44 from the center track assembly to the "receive" wafer carrier 40. It can be seen from an inspection of FIGS. 1 and 5 that in the "send" or feed position, the "send" wafer belt system 90 and a portion of the "receive" wafer belt system 92 define a "send" or feed wafer path for the unexposed wafer. The "receive" wafer belt system itself defines a "receive" or return wafer path for the exposed wafer. The two paths have a common portion indicated in FIG. 5 by the double-ended arrow 104.

The operation of the feed track assembly is controlled by the previously mentioned electronics, a portion of which is representationally shown in FIG. 5 by control box 106 and wiring 108. When the electronics commands the feed track assembly to load a wafer, it supplies power to the "send" and "receive" drive motors 94 and 96, respectively, and to a third drive motor 110 in the center track assembly (See FIG. 6) so that the unexposed wafers 42 move from the "send" carrier 38 toward the pre-alignment station 20 in the center track assembly. When the polarity of the motor voltages is reversed, the motors reverse their direction of rotation so that the exposed wafers 44 move from the pre-alignment station 20 toward the "receive" carrier 40. The polarity of the motor voltages is determined by the state of the machine cycle and the position of the operator control 46 for CARRIER FEED.

The feed or "send" wafer belt system 90 comprises two belts, 112 and 114 and a series of idler pulleys 116 which position the belt for correct operation. When the feed belt motor 94 is rotating in the load wafer direction, an unexposed wafer 42 will be transported out of the "send" carrier as the carrier indexes (moves down). The wafer, supported by the two belts 112 and 114, is moved out of the carrier makes a 90° turn, and is driven off the end of the feed belt onto the "receive" wafer belt system 92. Idler pulleys 118 are used to introduced a 90° turn in the feed belt system.

The "receive" or return wafer belt system 92 functions as both a feed and a return mechanism for the unexposed and exposed wafers, respectively. The "receive" wafer belt system comprises five belts 120, 122, 124, 126 and 128, idler pulleys 130 and a transfer track 132. The transfer track 132 is mounted on two shafts 134 and 136 that are fixed to the feed track assembly casting (not shown), so that the relative motion in one dimension is possible to accommodate various interfaces to the center track assembly. FIGS. 5a and 5b illustrate two relative positions of the transfer track 132. Driving power for the transfer track belts 124, 126 and 128 is obtained from idler drive roll 138.

When the load wafer direction is selected by the electronics, the wafer from the "send" wafer belt system 90 is moved to the transfer track 132 and onto the center track assembly 18. Conversely, when the return wafer direction is selected by the electronics, the wafer from the center track assembly is moved onto the end of the belts at the transfer track and then deposited in the "receive" carrier 40.

The presence of a wafer within each of the "send" and "receive" carriers is determined by photosensor systems 98 and 100, respectively. Each photosensor system comprises a light emitting diode (LED) 140 and a photosensor 142, as shown best in FIGS. 4 and 5. The photosensor system associated with the "send" carrier is mounted at the end of the "send" or feed wafer belt system 90 while the photosensor system associated with the "receive" carriers is mounted at the end of the "receive" return wafer belt system 92. The light emitting diodes 140 are mounted on the feed track casting 144 opposite the corresponding photosensors. The position of each LED 140 is adjustable, as shown in FIG. 5, for different sized wafer.

Figure 4:
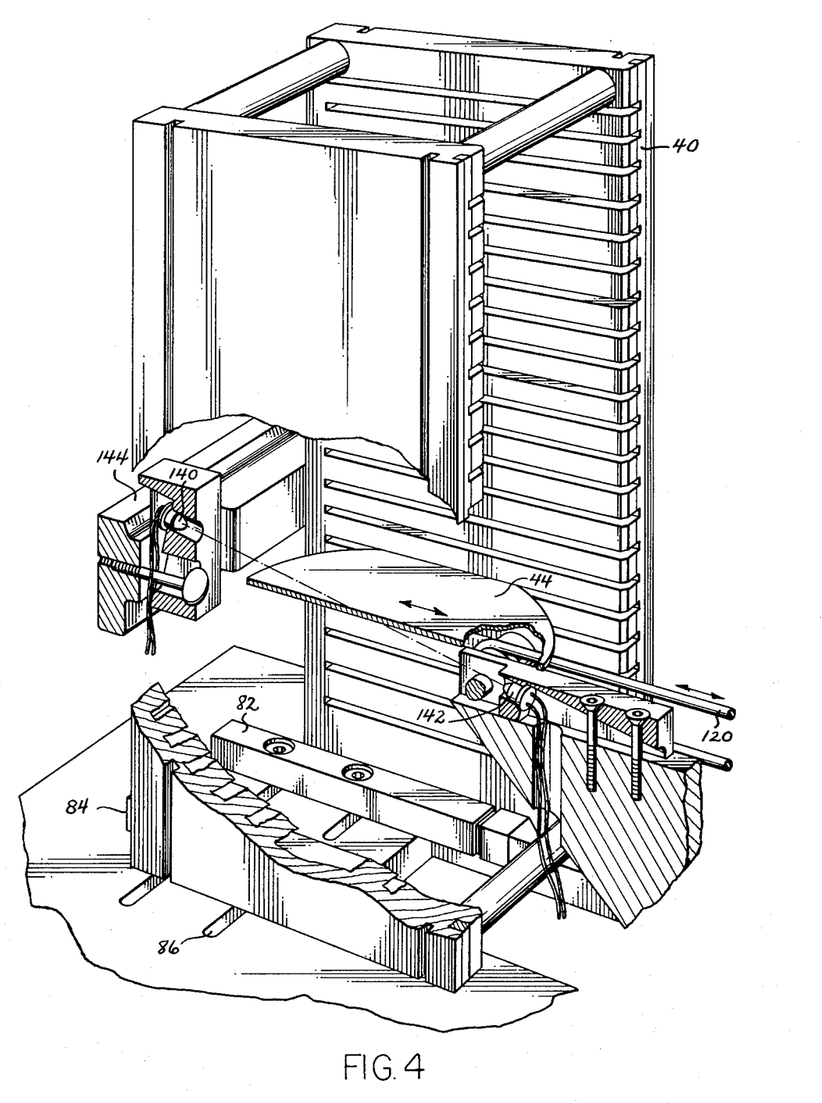
FIG. 4 is a view in perspective, partially broken away, illustrating the photosensor system used for detecting the presence or absence of a wafer within the carrier.

The numbering system employed in FIG. 4 corresponds to the appropriate components for the "receive" wafer carrier 40. However, it can be appreciated from an inspection of the detailed view shown in FIG. 4 of the wafer carrier, wafer belts and photosensing system that the illustration is equally applicable for both the "send" and "receive" wafer carriers. The double-ended arrow shown on wafer 44 represents the direction of motion of both the unexposed wafers 42 as well as the exposed wafers 44. Similarly, the double-ended arrow on belt 120 represents the "feed" and "return" directions of the feed track assembly.

CENTER TRACK ASSEMBLY

Figure 6:
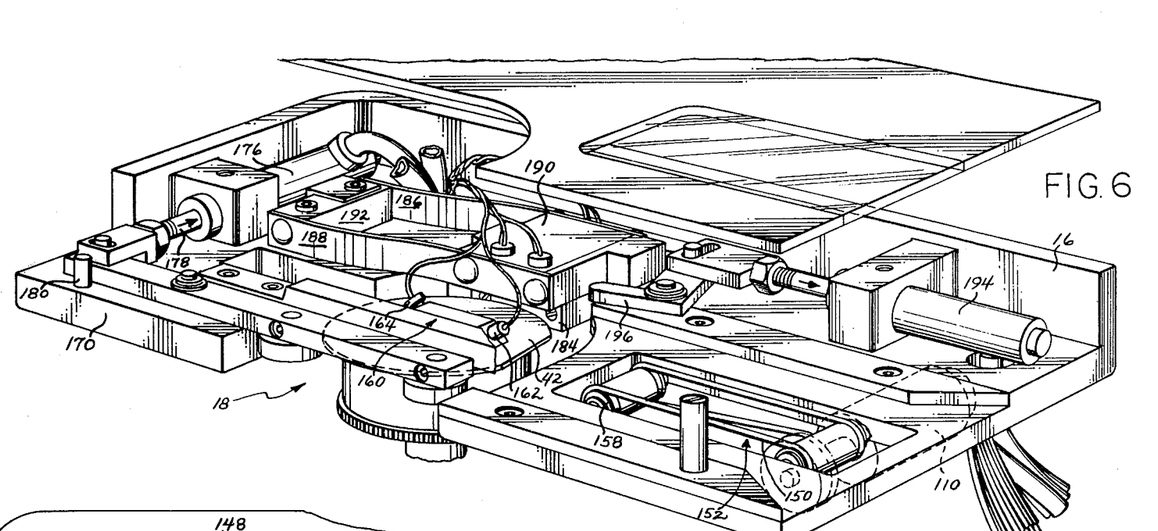
FIG. 6 is a view in perspective of the pre-alignment station showing the wafer roller arm and flat-identifier assemblies.
Figure 7:
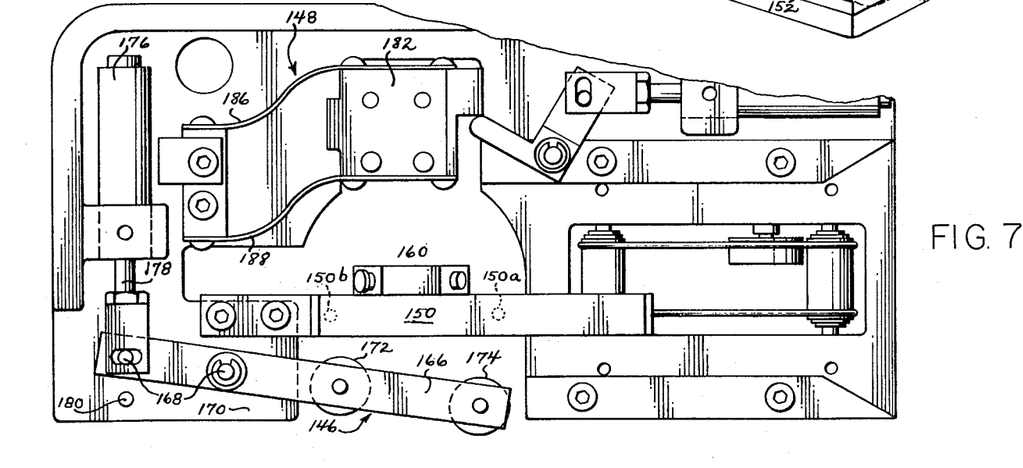
FIG. 7 is a plan view of the pre-alignment station shown in FIG. 6.

Having described the platform and feed track assemblies of the wafer loading and pre-alignment system of the present invention, we will now discuss the center track assembly 18 and its associated pre-alignment station 20. Referring to FIGS. 6 and 7, FIG. 6 depicts in perspective view the center track assembly and alignment station. FIG. 7 illustrates the same components in plan view. The center track assembly 16 attaches to the mask Aligner 10 and mechanically interfaces to the transfer track portion 102 of the feed track assembly 16. The major components of the center track assembly 18 are a roller arm system 146, a flat-identifier system 148, a nozzle block 150 and a belt system 152.

The purpose of the center track assembly 18 is to transfer wafers to and from a chuck 154 (FIG. 14), and to perform prealignment of the wafer 42 on the chuck. It has already been mentioned that when the electronics commands all belts to move in the "load" wafer direction, the center track assembly motor 110 actuates center track assembly belts 156. Reversing the polarity of the motor input voltage causes the belts 156 to move in the "return" wafer direction.

The center track assembly belt system comprises the previously mentioned drive motor 110, belts 156 and idler pulleys 158. When the center track assembly belts 156 are moving in the "load" wafer direction, (right-to-left as shown in FIGS. 6 and 7) the unexposed wafer 42 will be transported from the transfer track portion 102 onto the chuck 154 (FIG. 14). The movement of the unexposed wafer from the center track belt system to the chuck can be aided by means of a stream of nitrogen emitted from nozzle 150a of nozzle block 150 (FIGS. 6 and 7). The nitrogen stream leaves the nozzle 150a at an angle of approximately 15° from the horizontal thereby directing the wafer onto the chuck surface. Removal of the exposed wafer 44 from the chuck can be accomplished in a number of ways including mechanical pusher means to move the exposed wafer onto the center track belts 152. Alternatively, a second nitrogen nozzle 150b can be used to direct a stream of nitrogen in the opposite direction, again at an angle of 15° from the horizontal.

The presence of a wafer on chuck 154 is sensed by a wafer sensor 160 mounted on nozzle block 150. The wafer sensor comprises a photosensor 162 and a lamp 164. Light from the lamp is directed down onto the wafer 42 and reflected back from the surface of the wafer to the photosensor 162. The output from the photosensor 162 is used to establish a "wafer present" signal for the system control circuitry.

CENTER TRACK ASSEMBLY PRE-ALIGNMENT STATION

Two systems are employed to pre-align the unexposed wafer 42 on the surface of chuck 154; the roller arm system 146 and flat-identifier system 148. The roller arm system comprises a bearing arm 166 which pivots about a pin 168 mounted on the center track casting 170. Two rollers 172 and 174 are pivotally mounted on bearing arm 166. The bearing arm 166 is mechanically coupled to an air cylinder 176 mounted on the center track casting. When the electronics commands the pre-alignment sequence, air from a solenoid actuated valve (not shown) flows through a restricting orifice and a spring-loaded accumulator (both of which are not shown) to the roller arm cylinder 176. The cylinder pistor 178 moves out, forcing the bearing arm up against dowel pin 180, and the rollers 172 and 174 against the edge of the unexposed wafer 42. The rollers act as a fixed reference surface during the pre-alignment sequence.

The restricting orifice on the input to air cylinder 176 is used to provide a slow engaging movement of the bearing arm and a rapid retracting movement. This sequence prevents the bearing arm from suddenly altering the position of the unexposed wafer 42 on the chuck. The spring-loaded accumulator is provided in the system to prevent to retraction of the roller arm system 146 when the flat identifier system 148 retracts before the final pre-alignment operation as will be discussed below.

Figure 8:
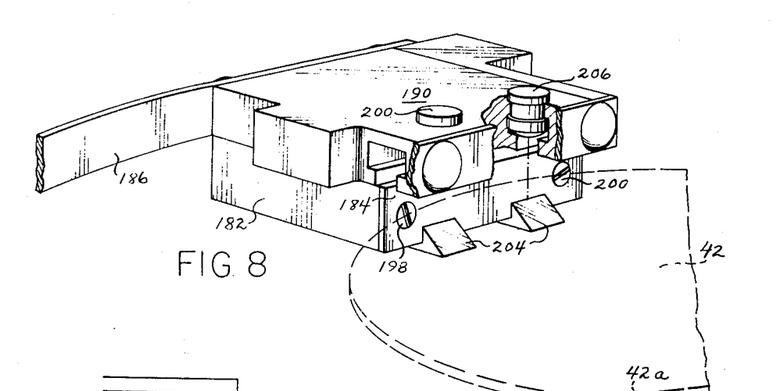
FIG. 8 is a view in perspective illustrating the relationship of the wafer flat-identifier and the wafer.

The flat identifier system 148 comprises a flat identifier block 182, and insert 184 (best seen in FIGS. 8 and 9), two parallel springs 186 and 188 and a flat-finder photosensor assembly 190. The flat indentifier block 182 containing insert 184 and photosensor assembly 190 is mounted between the distal ends of parallel springs 186 and 188. The fixed ends of the springs are attached to a mounting block 192 located on the center track casting 170. The springs tend to move the flat-identifier block insert 184 up against the edge of the wafer 42. An air cylinder 194 and lever 196 are employed to retract the flat-identifier block whenever the electronics commands a solenoid actuated valve (not shown) to supply a vacuum to the roller arm cylinder 176. Since the flat-identifier and roller arm are controlled by the same solenoid actuated valve which provides air or a vacuum to cylinders 176 and 194, the cylinders work together to pre-align the wafer on the chuck. During the pre-alignment sequence, the wafer is rotated, as will be explained subsequently, until the photosensor assembly 190 detects that the wafer flat 42a (See FIGS. 8 and 10) is against the flat identifier insert 184. The photosensor assembly 190 then signals the electronics that the initial pre-alignment has been accomplished.

The purpose of the flat-identifer block 182 is to center the unexposed wafer 42 between the two rollers 172 and 174 on the bearing arm and the flat finder insert 184. The flat finder insert 184 is mounted on the flat-identifier block by two screws 198 and 200 so that it may be replaced when excessive wear develops.

Figure 9:
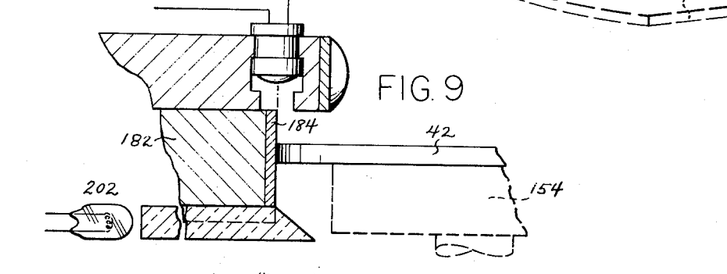
FIG. 9 is a view in vertical cross section of the flat-identifier shown in FIG. 8.
Figure 10A:
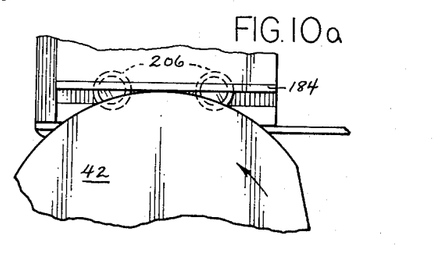
FIGS. 10a, 10b and 10c illustrate the sequential operation of the pre-alignment station flat-identifier.
Figure 10B:
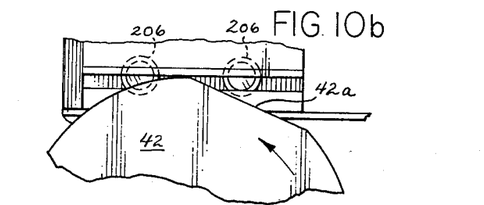
Figure 10C:
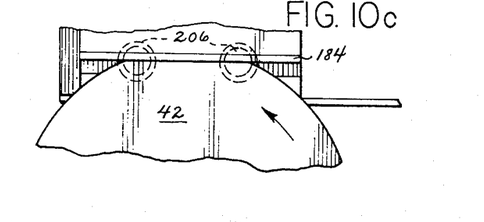

The wafer flat is detected by the photosensor assembly 190. The photosensor assembly comprises two lamps 202, one of which is shown in FIG. 9, two optical light guides 204 and two photosensors 206. Referring to FIG. 9, it can be seen that the chuck 154 is slightly smaller in diameter than the unexposed wafer 42. The undersized chuck permits the establishment of a light path between the light guides 204 and photosensors 206 when the wafer is misaligned. The light from the lamps 202 passes through the guides, is bent 90° to the vertical direction and impinges upon the photosensors 206 when the flat is not aligned with the insert. When the flat is aligned with the insert, the insert moves forward under the spring loading of springs 186 and 188 to block both light beams. This alignment sequence is illustrated in FIGS. 10a through 10c. When both light beams are blocked by the wafer, as shown in FIG. 10c, the photosensor assembly 190 signals the electronics that the wafer flat 42a contacts the flat-identifier insert 184.

Figure 11:
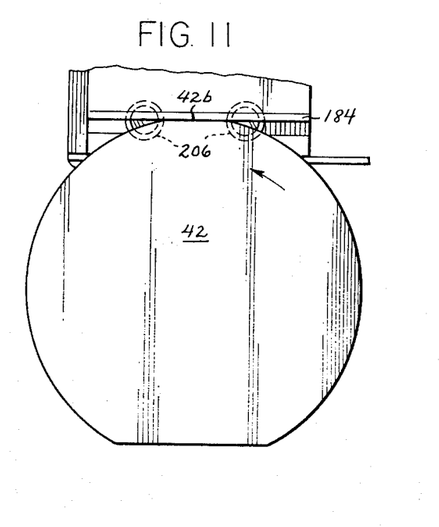
FIG. 11 is another view of the flat-identifier depicting the relationship between the spacing of the flat-identifier photosensors and the width of the wafer flat.

Looking at FIGS. 10a through 10c and FIGS. 11 and 12, it can be seen that both of the light beams will be blocked only when the wafer flat 42a is in contact with the flat-identifier insert 184 and only if the length of the flat is sufficient to cover both light beams. This relationship can best be seen by comparing the length of the major wafer flat 42a in FIGS. 10a through 10c with the minor wafer flat 42b in FIGS. 11 and 12. Referring to FIGS. 10c and 11, it can be seen that given the same spacing between the photosensors 206, the major flat 42a in FIG. 10c will block both photosensors completely while the minor flat 42b shown in FIG. 11 will only partially block the photosensors.

Figure 12:
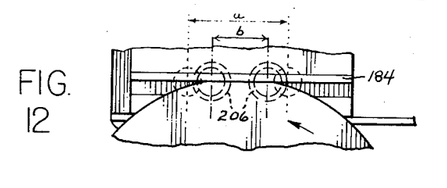
FIG. 12 is another view of the flat-identifier in which the photosensors are spaced closer together in order to detect a minor flat on the wafer.

The distance between the photosensors in FIGS. 10a through 10c and 11 is identified in FIG. 12 by the letter a and represents the length of the major wafer flat 42a. Differentiation between major and minor wafer flats can be obtained in the present invention by pre-selecting the spacing between the photosensors 206. For example, assuming that the minor flat 42b shown in FIG. 11 is to be detected, the photosensors 206 should be spaced at a distance identified by the letter b in FIG. 12.

It will be appreciated from an inspection of FIGS. 10a through 10c, 11 and 12 that the wafer 42 is rotated with respect to the flat-identifier block insert 184 during the pre-alignment sequence. The wafer is rotated by the previously mentioned chuck lifter assembly 22.

CHUCK LIFTER ASSEMBLY

The chuck lifter assembly which is depicted in FIGS. 13 and 14 and partially shown in FIG. 6 comprises a chuck lifter 208, drive motor 210 and piston assembly 212. Looking at FIG. 14, the purpose of the chuck lifter assembly is to lift the chuck 154 off the Aligner turntable 214 or to set it back down on the turntable, to secure the wafer to the chuck, and to rotate the wafer and chuck during the pre-alignment sequence.

Vertical movement of the piston assembly 212 is controlled by the pressure within a lower chamber 216 formed by piston seal 218, the cylinder walls 220 and cylinder seal 222. The lower chamber 216 is connected through line 224 (FIG. 13) to an electrically actuated solenoid valve (not shown) which couples the line to a vacuum or pressure source. The air flow through line 224 to the lower chamber 216 passes through a flow-control orifice (not shown) to provide slow, smooth operation of the chuck lifter. The chuck lifter 208 moves in an upwardly direction, as shown in FIG. 14, until it contacts the lower surface of chuck 154 which is positioned on the Aligner turntable 214.

A hollow, tapered pin 226 on the chuck lifter engages a corresponding tapered aperture 228 in the chuck and centers the chuck on the lifter. The tapered chuck aperture 228 is fluidly coupled to a plurality of apertures 230 located on the upper surface of the chuck. The tapered pin 226 is fluidly coupled through hollow piston 232 and piston aperture 234 to an upper chamber 236 formed above the piston seal 218. The upper chamber 236 is connected through line 238 to an electrically actuated solenoid valve (not shown) which couples the line 238 to either a vacuum or air pressure source (not shown).

The chuck lifter 208 is mounted on a gear 240 which is driven by a pinion gear 242 connected to the drive shaft of motor 210. Motor 210 is used to rotate the chuck lifter 208 and thereby the chuck and wafer during the pre-alignment sequence.

The operational sequence of the chuck lifter assembly during the pre-alignment sequence will now be described. Assuming that the wafer sensor 160 (FIG. 6) detects the presence of an unexposed wafer 42 on the chuck, the pre-alignment sequence will be initiated by the electronics. Air is supplied through line 224 to the lower chamber 216 of the chuck lifter assembly causing the lifter 208 to move upwardly until the tapered pin 226 engages the corresponding tapered aperture 228 in the chuck 154. The tapered pin centers the chuck on the chuck lifter 208 and the chuck and chuck lifter continue in an upwardly direction, as viewed in FIG. 14, until the chuck clears the turntable surface. Air is also supplied to cylinders 176 and 194 (FIG. 6) to engage the roller bearing arm rollers 172 and 174 against the wafer edge and to permit the spring-loaded flat-identifier insert 184 to move against the wafer edge. Vacuum is supplied from line 238 to the chuck surface through the previously described hollow, tapered pin-chuck aperture system in order to clamp the wafer to the chuck. The unexposed wafer 42 is now roughly aligned.

The chuck lifter 208 is then rotated by the lifter drive motor 210 through gears 242 and 240. The chuck and wafer rotate together with the chuck lifter. During the rotation of the chuck and wafer, the vacuum supplied to the chuck surface from vacuum/air supply line 238 is pulsed to allow the wafer position to vary during rotation. The supply line 238 is alternately connected through a solenoid actuated valve (not shown) to a vacuum or ambiant-pressure air so that the wafer can be positioned on the chuck while being rotated. As the wafer rotates, it is centered between the bearing arm rollers 172 and 174 by pressure from the flat-identifier insert 184.

When the wafer flat 42a is aligned with the insert surface, as shown in FIG. 10c, the photosensor 190 signals the electronics and the drive motor is turned off to stop the wafer rotation. The roller bearing arm and flat identifier block 182 are retracted by applying a vacuum to cylinders 176 and 194 (FIG. 6) and then re-engaged to perform the final positioning of the pre-alignment sequence. The re-engagement is accomplished by applying air pressure to both cylinders. After final positioning of the wafer, the roller arm system and flat identifier system are disengaged by applying vacuum to cylinders 176 and 194. The pulsing of the vacuum to the chuck surface is also terminated so that vacuum is continuously supplied to the chuck surface through apertures 230.

The chuck lifter 208 is now lowered by supplying vacuum to the lower chamber through vacuum/air supply line 224. The wafer and chuck are lowered until they contact the Aligner turntable 214 and are held therein. The chuck lifter continues to lower until it reaches the full down condition at which point a microswitch (not shown) signals the electronics that the chuck lifter has reached this position. The vacuum to the lower chamber is terminated and the Aligner turntable is now ready for rotation to its "home" position in the Aligner.

Having described in detail the preferred embodiment of our invention, it will now be apparent to those skilled in the art that numerous modifications can be made therein without departing from scope of the invention as defined in the claims. For example, if the pre-alignment feature is not desired, the loading portion of the system can be interfaced to existing mask aligners with or without the center track belt system. In this situation, the feed and return wafer belt transport systems terminate at the wafer loading station of the mask aligner. Similarly, the pre-alignment portion of the system can be used independently from the loading portion. However, it will be appreciated that the maximum benefits of the invention will accrue to the user only if both the wafer loading and pre-alignment portions are used together in the manner described above.

What we claim and desire to secure by Letters Patent of the United States is:

1. A pre-alignment system for initially aligning on a chuck, a generally circular integrated circuit wafer having a flat edge portion, said pre-alignment system comprising:
   a wafer chuck having means for vacuum clamping a wafer to the chuck surface;
   a pivotally mounted bearing arm having two rotatable mounted rollers located at one end of the arm for engagement with the wafer edge in a first position and retracted therefrom in a second position;
   means for moving said bearing arm between said first and second positions to engage and retract said rollers from the edge of said wafer;
   a spring loaded wafer flat-identifier means having a flat surface which is urged against the wafer edge under spring loading in a first position and which is retracted therefrom in a second position;
   means for retracting said spring loaded flat-identifier flat surface from the edge of said wafer;
   means for alternately supplying a vacuum and air to said chuck vacuum clamping means whereby a wafer in said chuck is alternately clamped to and released from the surface of said chuck; and,
   means for rotating said chuck.

2. The pre-alignment system of claim 1 further characterized by means for detecting when the flat surface of flat-identifier means contacts the flat edge portion of the wafer.

3. The pre-alignment system of claim 2 wherein said chuck is smaller than the wafer so that a portion of the wafer including the flat edge portion thereof extends beyond the chuck.

4. The pre-alignment system of claim 3 wherein said detecting means comprises:
   means located on one side of the extended wafer portion for generating first and second beams of light along the flat surface of said flat-identifier; and,
   corresponding first and second light beam responsive means located on the other side of said extended wafer portion to intercept the light beams, said first and second light beam responsive means being positioned so that the wafer blocks both light beams thereto only when the flat surface of the flat-identifier is in full contact with the flat edge portion of said wafer.

5. The pre-alignment system of claim 4 wherein the position of said first and second light beam responsive means is determined by the length of the flat edge portion of said wafer.

6. The pre-alignment system of claim 4 wherein said wafer has a major and at least one minor flat edge portion and the position of said first and second light beam responsive means is determined by the length of the major flat edge portion.

7. The pre-alignment system of claim 4 wherein said wafer has a major and at least one minor flat edge portion and the position of said first and second light beam responsive means is determined by the length of the minor flat edge portion.

* * * * *